US010002898B2

(12) United States Patent
Lee et al.

(10) Patent No.: US 10,002,898 B2
(45) Date of Patent: Jun. 19, 2018

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Gae Hwang Lee, Seongnam-si (KR); Seon-Jeong Lim, Yongin-si (KR); Yong Wan Jin, Seoul (KR)

(73) Assignee: Samsung Electronics CO., Ltd., Gyeonggi-Do (KR)

(*) Notice: Subject to any disclaimer, the term of this patent is extended or adjusted under 35 U.S.C. 154(b) by 0 days. days.

(21) Appl. No.: 15/160,288

(22) Filed: May 20, 2016

(65) Prior Publication Data

US 2017/0053958 A1 Feb. 23, 2017

(30) Foreign Application Priority Data

Aug. 21, 2015 (KR) ........................ 10-2015-0118209

(51) Int. Cl.
*H01L 27/146* (2006.01)
*H01L 27/30* (2006.01)
*H01L 31/101* (2006.01)

(52) U.S. Cl.
CPC .. *H01L 27/14621* (2013.01); *H01L 27/14643* (2013.01); *H01L 27/302* (2013.01); *H01L 27/307* (2013.01); *H01L 31/101* (2013.01); *H01L 31/1013* (2013.01)

(58) Field of Classification Search
CPC .................... H01L 27/14621; H01L 27/14643
See application file for complete search history.

(56) References Cited

U.S. PATENT DOCUMENTS 6,150,683 A * 11/2000 Merrill .............. H01L 27/14645 257/292
8,670,051 B2 3/2014 Kato
2002/0058353 A1* 5/2002 Merrill .............. H01L 27/14621 438/57
2003/0209651 A1* 11/2003 Iwasaki ................. H01L 27/302 250/214.1
2005/0109917 A1* 5/2005 Wong ................ H01L 27/14609 250/208.1

(Continued)

FOREIGN PATENT DOCUMENTS

KR 20100090971 A 8/2010

*Primary Examiner* — Ermias Woldegeorgis
(74) *Attorney, Agent, or Firm* — Harness, Dickey & Pierce, P.L.C.

(57) ABSTRACT

An image sensor includes a first light detecting device configured to selectively sense or absorb first visible light, a second light detecting device configured to selectively sense or absorb second visible light having a longer wavelength region than the first visible light, and a third light detecting device on the first light detecting device and the second light detecting device. The first light detecting device has one of a maximum transmission wavelength and a maximum absorption wavelength less than about 440 nm, the second light detecting device has one of a maximum transmission wavelength and a maximum absorption wavelength greater than about 630 nm, and the third light detecting device is configured to selectively sense or absorb third visible light having a wavelength region between the first visible light and the second visible light.

9 Claims, 10 Drawing Sheets

Transmittance (%)
0
20
40
60
80
100
400
500
600
$\lambda_{mid}$
$\lambda_{max}$
700
Wavelength (nm)

(56) References Cited

U.S. PATENT DOCUMENTS

2005/0230775 A1* 10/2005 Watanabe ......... H01L 27/14692 257/444
2006/0286455 A1 12/2006 Kim et al.
2009/0086323 A1 4/2009 Nobuyuki
2009/0140123 A1* 6/2009 Shen ..................... H01L 27/307 250/206
2010/0201926 A1 8/2010 Lee
2012/0033116 A1 2/2012 Kato
2012/0052388 A1 3/2012 Jung et al.
2012/0264015 A1 10/2012 Jung et al.
2014/0087268 A1 3/2014 Kim et al.
2014/0091418 A1 4/2014 Taguchi et al.
2014/0145287 A1 5/2014 Kato
2014/0154578 A1 6/2014 Yoo et al.
2014/0178754 A1 6/2014 Kim et al.
2014/0377643 A1 12/2014 Lee et al.
2015/0072240 A1 3/2015 Yoo et al.

* cited by examiner

IMAGE SENSOR AND ELECTRONIC DEVICE INCLUDING THE SAME

CROSS REFERENCE TO RELATED APPLICATION

This application claims priority to and the benefit of Korean Patent Application No. 10-2015-0118209 filed in the Korean Intellectual Property Office on Aug. 21, 2015, the entire contents of which are incorporated herein by reference.

BACKGROUND

1. Field

Example embodiments provide an image sensor and an electronic device including the same.

2. Description of the Related Art

An imaging device is used in a digital camera and a camcorder, etc., to capture an image and to store the image as an electrical signal. The imaging device includes an image sensor separating incident light according to a wavelength and converting each component to an electrical signal.

There has been an ongoing demand for reduction in the size of the image sensor. Recently, in order to reduce the image sensor size, an image sensor having a stacking structure has been researched.

However, in the image sensor having the stacking structure, a color signal of a lower device may be distorted by an upper device where the image sensor receives light first, and the color signal of the lower device may be distorted by structural problems of the stacking. Thereby, the color reproduction characteristics of the image sensor may be deteriorated.

SUMMARY

Example embodiments provide an image sensor which is capable of reducing or preventing the deterioration of color reproduction characteristics due to the stacking structure.

Example embodiments also provide an electronic device including the image sensor.

According to example embodiments, an image sensor includes a first light detecting device configured to selectively sense or absorb first visible light, a second light detecting device configured to selectively sense or absorb second visible light having a longer wavelength region than the first visible light, and a third light detecting device on the first light detecting device and the second light detecting device and configured to selectively sense or absorb third visible light having a wavelength region between the first visible light and the second visible light. The first light detecting device has one of a maximum transmission wavelength and a maximum absorption wavelength less than about 440 nm, and the second light detecting device has one of a maximum transmission wavelength and a maximum absorption wavelength greater than about 630 nm.

The one of the maximum transmission wavelength and the maximum absorption wavelength of the first light detecting device may be greater than or equal to about 380 nm and less than about 440 nm, and the one of the maximum transmission wavelength and the maximum absorption wavelength of the second light detecting device may be about greater than about 630 nm and less than or equal to about 700 nm.

The one of the maximum transmission wavelength and the maximum absorption wavelength of the third light detecting device may be about 520 nm to about 560 nm.

The first light detecting device may include a first photo-sensing device configured to sense the first visible light and a first color filter overlapping the first photo-sensing device and having a maximum transmission wavelength of less than about 440 nm, and the second light detecting device may include a second photo-sensing device configured to sense the second visible light and a second color filter overlapping the second photo-sensing device and having a maximum transmission wavelength greater than about 630 nm.

A wavelength corresponding to half of the maximum transmission of the first color filter may be less than about 480 nm, and a wavelength corresponding to half of the maximum transmission of the second color filter may be greater than about 610 nm.

The first photo-sensing device and the second photo-sensing device may be integrated in a semiconductor substrate.

The first photo-sensing device and the second photo-sensing device may be spaced apart from each other in a horizontal direction.

The first photo-sensing device and the second photo-sensing device may be spaced apart from each other in a vertical direction.

The third light detecting device may include a first electrode and a second electrode facing each other, and a first light-absorption layer between the first electrode and the second electrode and configured to selectively absorb the third visible light.

The first light-absorption layer may include a p-type semiconductor and an n-type semiconductor, and at least one of the p-type semiconductor and the n-type semiconductor may selectively absorb the third visible light.

The first light detecting device may include a third electrode and a fourth electrode facing each other, and a second light-absorption layer between the third electrode and the fourth electrode and configured to selectively absorb the first visible light and having a maximum absorption wavelength less than about 440 nm, and the second light detecting device may include a fifth electrode and a sixth electrode facing each other, and a third light-absorption layer between the fifth electrode and the sixth electrode and configured to selectively absorb the second visible light.

A wavelength corresponding to half of the maximum absorption of the second light-absorption layer may be less than about 480 nm.

The second light-absorption layer may include a p-type semiconductor and an n-type semiconductor, and at least one of the p-type semiconductor and the n-type semiconductor may selectively absorb the first visible light.

The second light detecting device may include a first electrode and a second electrode facing each other and a first light-absorption layer between the first electrode and the second electrode, the first light-absorption layer configured to selectively absorb the second visible light and having a maximum absorption wavelength greater than about 630 nm.

A wavelength corresponding to half of the maximum absorption of the first light-absorption layer may be greater than about 610 nm.

The third light-absorption layer may include a p-type semiconductor and an n-type semiconductor, and at least one of the p-type semiconductor and the n-type semiconductor selectively absorbs the second visible light.

The first light detecting device may include a first electrode and a second electrode facing each other and a first light-absorption layer between the first electrode and the second electrode and configured to selectively absorb the first visible light and having a maximum absorption wavelength of about 440 nm, and the second light detecting device may include a third electrode and a fourth electrode facing each other and a second light-absorption layer between the third electrode and the fourth electrode, the second light-absorption layer configured to selectively absorb the second visible light and having a maximum absorption wavelength greater than about 630 nm.

A wavelength corresponding to half of the maximum absorption of the second light-absorption layer may be less than about 480 nm, and a wavelength corresponding to half of the maximum absorption of the third light-absorption layer may be greater than about 610 nm.

The third light detecting device may be closer to the light incident side than the first and second light detecting devices.

According to example embodiments, an electronic device includes the image sensor of example embodiments.

DETAILED DESCRIPTION

Figure 1:
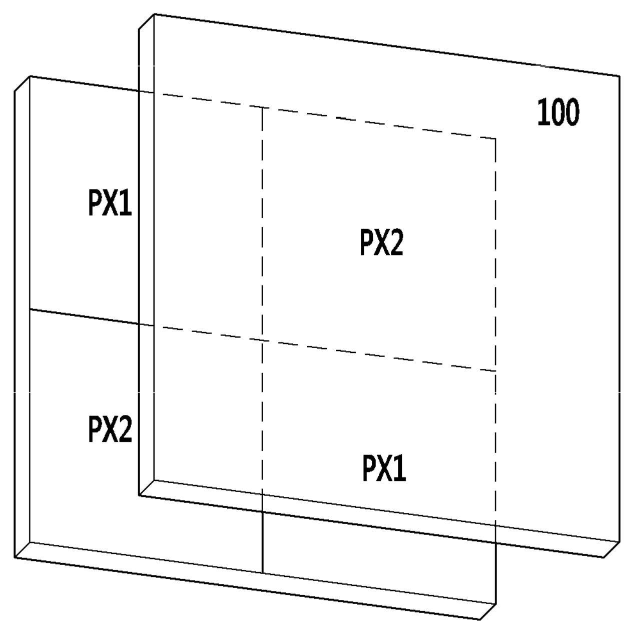
FIG. 1 is a top plan view showing one example of an image sensor according to example embodiments.

Example embodiments of the present inventive concepts will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," etc.) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an image sensor according to example embodiments is described.

An image sensor according to example embodiments includes a first light detecting device, a second light detecting device, and a third light detecting device that sense or absorb light (hereinafter referred to as 'visible light') having different visible ray regions from each other. For example, the first light detecting device may primarily selectively sense or absorb first visible light of a shorter wavelength region, the second light detecting device may be primarily selectively sense or absorb second visible light of a longer wavelength region than that of the first visible light, and the third light detecting device may primarily selectively sense or absorb third visible light of a wavelength region between the first visible light and the second visible light.

Herein, 'primarily' means greater than or equal to about 80%, and within the range, greater than or equal to about 90%.

The first visible light may be light in a wavelength region of greater than or equal to about 380 nm and less than about 500 nm, the second visible light may be light in a wavelength region of, for example, greater than about 600 nm and less than about 700 nm, and the third visible light may be light in a wavelength region of, for example, about 500 nm to about 600 nm.

At least two of the first light detecting device, the second light detecting device, and the third light detecting device may be stacked.

For example, the third light detecting device may be disposed on the first light detecting device and the second light detecting device.

For example, the first light detecting device and the second light detecting device may be disposed in parallel, and the third light detecting device may be disposed on the first light detecting device and the second light detecting device.

For example, the first light detecting device and the second light detecting device are vertically disposed, and the third light detecting device may be disposed on the first light detecting device and the second light detecting device.

The first light detecting device, the second light detecting device, and/or the third light detecting device may be integrated in the semiconductor substrate or may be stacked on the semiconductor substrate. The semiconductor substrate may be, for example, a silicon substrate. A transmission transistor and a charge storage may be integrated in the semiconductor substrate.

The first light detecting device, the second light detecting device, and the third light detecting device may independently include a photo-sensing device or a photoelectric device. The photo-sensing device may be, for example, a photodiode. The photoelectric device may include, for example, a light-absorption layer between a pair of electrodes facing each other, and may be, for example, an organic photoelectric device.

When the first light detecting device, second light detecting device, and/or third light detecting device include a photo-sensing device, the first light detecting device, the second light detecting device, and/or the third light detecting device may further include a color filter which selectively transmits light in a given (or alternatively, predetermined) wavelength region.

According to example embodiments, unlike the conventional image sensor having a non-stacking structure, light transmission characteristics or light absorption characteristics of a light detective device disposed in the lower part may be modified to be suitable for the image sensor having a stacking structure, and specifically, a maximum transmission wavelength or a maximum absorption wavelength of the light detecting device disposed in the lower part may be modified.

For example, in an image sensor having a structure where the third light detecting device is stacked on the first light detecting device and the second light detecting device, a maximum transmission wavelength or a maximum absorption wavelength of the first light detecting device may be less than about 440 nm, and a maximum transmission wavelength or a maximum absorption wavelength of the second light detecting device may be greater than about 630 nm.

For example, the maximum transmission wavelength or the maximum absorption wavelength of the first light detecting device may be greater than or equal to about 380 nm and less than about 440 nm, and the maximum transmission wavelength or the maximum absorption wavelength of the second light detecting device may be about greater than about 630 nm and less than or equal to about 700 nm.

For example, when the first light detecting device and the second light detecting device include a photo-sensing device, e.g., a photo-diode, the maximum transmission wavelength may be related to the maximum transmission wavelength of the color filter which determines the light transmission of the first light detecting device and the second light detecting device.

For example, when the first light detecting device and the second light detecting device include a photoelectric device, the maximum absorption wavelength may be related to the maximum absorption wavelength of the light-absorption layer which determines the absorbance of the first light detecting device and the second light detecting device.

An image sensor according to example embodiments will now be described with reference to the drawings. Herein, a CMOS image sensor as an example of an image sensor is described.

Example embodiments illustrates a structure in which the first light detecting device and the second light detecting device include a photo-sensing device and a color filter, respectively, and the third light detecting device includes a photoelectric device, but is not limited thereto.

Figure 2:
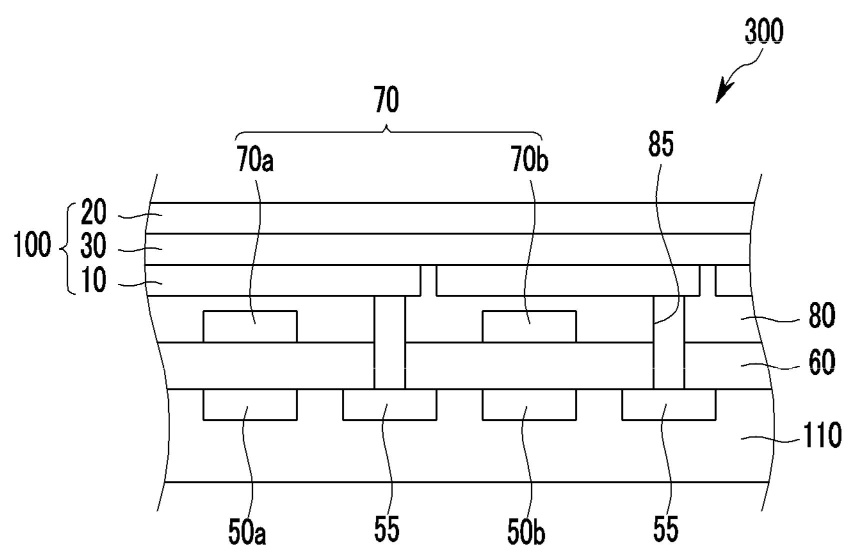
FIG. 2 is a cross-sectional view showing one example of an image sensor shown in FIG. 1.

FIG. 1 is a top plan view schematically showing one example of an image sensor according to example embodiments, and FIG. 2 is a cross-sectional view showing an image sensor shown in FIG. 1.

Hereinafter, the terms 'lower' and 'upper' are used for better understanding and ease of description, but do not limit the position relationship.

In the following description, it is described that the light-receiving surface of the image sensor is used as 'upper' of the image sensor, but this is for the better understanding and ease of description, and does not limit the position relationship.

The image sensor according to example embodiments has a pixel arrangement in which unit pixel groups including a plurality of pixels is repeatedly arranged along a row and/or a column.

Referring to FIG. 1, the unit pixel group of the image sensor according to example embodiments includes two rows and two columns (2×2), and includes a first pixel (PX1) and a second pixel (PX2) sensing light in different wavelengths from each other in the visible light region. In addition, a photoelectric device 100 is overlapped on the whole surface of the unit pixel group.

For example, the first pixel (PX1) may include a first light detecting device and the second pixel (PX2) may include a second light detecting device. For example, the first pixel (PX1) may include a first light detecting device capable of primarily transmitting or absorbing light in a wavelength region of, for example, greater than or equal to about 380 nm and less than about 500 nm, and the second pixel (PX2) may include a second light detecting device capable of primarily transmitting or absorbing light in a wavelength region of, for example, greater than about 600 nm and less than about 700 nm.

The third light detecting device is disposed on the whole surface of the first pixel (PX1) and the second pixel (PX2) and is, for example, a photoelectric device 100 capable of primarily transmitting or absorbing light in a wavelength region of about 500 nm to about 600 nm.

Referring to FIGS. 1 and 2, an image sensor 300 according to example embodiments includes a semiconductor substrate 110, a lower insulation layer 60, a color filter layer 70, an upper insulation layer 80, and the photoelectric device 100.

The semiconductor substrate 110 may be a silicon substrate, and may be integrated with a first photo-sensing device 50*a*, a second photo-sensing device 50*b*, a transmission transistor (not shown), and a charge storage device 55. The first photo-sensing device 50*a* and the second photo-sensing device 50*b* may independently be photodiodes.

The first photo-sensing device 50*a* may sense first visible light and the sensed information may be transferred by the transmission transistor, and the second photo-sensing device 50*b* may sense second visible light and the sensed information may be transferred by the transmission transistor. Light is selectively filtered by the later-described first color filter to deliver the first visible light to the first photo-sensing device 50*a* or selectively filtered by the later-described second color filter to deliver the second visible light to the second photo-sensing device 50*b*.

The charge storage device 55 may be electrically connected to the later-described photoelectric device 100, and the information of the charge storage device 55 may be transported by a transmission transistor.

FIG. 2 illustrates a structure in which the first photo-sensing device 50*a* and the second photo-sensing device 50*b* are spaced apart from each other in a horizontal direction as one example, but is not limited thereto, and the first photo-sensing device 50*a* and the second photo-sensing device 50*b* may be spaced apart from each other in a vertical direction.

Metal wires (not shown) and pads (not shown) are formed on the semiconductor substrate 110. In order to decrease signal delay, the metal wires and pads may be made of a metal having relatively low resistivity, for example, aluminum (Al), copper (Cu), silver (Ag), and alloys thereof, but are not limited thereto. However, without being limited to the structure, the metal wires and pads may be positioned under the photo-sensing devices 50*a* and 50*b*.

The lower insulation layer 60 may be formed on the metal wires and pads. The lower insulation layer 60 may be made of an inorganic insulation material, for example, a silicon oxide and/or a silicon nitride, or a relatively low dielectric constant (low K) material, for example, SiC, SiCOH, SiCO, and SiOF. The lower insulation layer 60 has a trench exposing the charge storage device 55. The trench may be filled with fillers.

The color filter layer 70 is formed on the lower insulation layer 60. The color filter layer 70 includes a first color filter 70*a* selectively transmitting first visible light and a second color filter 70*b* selectively transmitting second visible light. The first color filter 70*a* may be overlapped with the first photo-sensing device 50*a*, and the second color filter 70*b* may be overlapped with the second photo-sensing device 50*b*. Although example embodiments illustrated in FIG. 2 describe one example in which the color filter selectively transmitting third visible light is not included, example embodiments may further include a color filter selectively transmitting third visible light.

The first color filter 70*a* may selectively transmit first visible light but may absorb and/or reflect other visible light except the first visible light. For example, the first color filter 70*a* may primarily transmit light in a wavelength region of greater than or equal to about 380 nm and less than about 500 nm, and absorb and/or reflect other visible light. Thereby, the first visible light passed through the first color filter 70*a* may be transported into a first photo-sensing device 50*a*.

The second color filter 70*b* may selectively transmit the second visible light but absorb and/or reflect other visible light except the second visible light. For example, the second color filter 70*b* may primarily transmit light in a wavelength region of greater than about 600 nm and less than or equal to about 700 nm, and absorb and/or reflect other visible light. Thereby, the second visible light passed through the second color filter 70*b* may be transported to the second photo-sensing device 50*b*.

According to example embodiments, unlike the conventional image sensor having a non-stacking structure, the light transmission characteristics of the first color filter 70*a* and the second color filter 70*b* may be modified to be suitable for the image sensor having a stacking structure, and specifically, the maximum transmission wavelength of the first color filter 70*a* and the second color filter 70*b* may be modified, which is described later.

The upper insulation layer 80 is formed on the color filter layer 70. The upper insulation layer 80 may eliminate a step caused by the color filter layer 70 and smooth the surface. The upper insulation layer 80 and lower insulation layer 60 may include a contact hole (not shown) exposing a pad, and a through-hole 85 exposing the charge storage 55.

The photoelectric device 100 is formed on the upper insulation layer 80. The photoelectric device 100 includes a lower electrode 10 and an upper electrode 20 facing each other, and a light-absorption layer 30 selectively absorbing third visible light.

One of the lower electrode 10 and the upper electrode 20 is an anode and the other is a cathode. At least one of the lower electrode 10 and the upper electrode 20 may be a light-transmitting electrode, and the light-transmitting electrode may be made of, for example, a transparent conductor, for example, indium tin oxide (ITO) or indium zinc oxide (IZO), or a metal thin layer of a thin monolayer or multilayer. When one of the lower electrode 10 and the upper electrode 20 is a non-light-transmitting electrode, the non-light-transmitting electrode may be made of, for example, an opaque conductor, e.g., aluminum (Al). For example, both the lower electrode 10 and the upper electrode 20 may be light-transmitting electrodes.

The light-absorption layer 30 includes a p-type semiconductor and an n-type semiconductor to form a pn junction, and absorbs external light to generate excitons and then separates the generated excitons into holes and electrons.

The light-absorption layer 30 selectively mainly absorbs third visible light. The third visible light may be, for example, light in an about 500 nm to 600 nm wavelength region, and a maximum absorption wavelength of the light-absorption layer 30 may be, for example, about 520 nm to 560 nm.

The light-absorption layer 30 may include a p-type semiconductor and an n-type semiconductor, and at least one of the p-type semiconductor and the n-type semiconductor may be a light-absorbing material that selectively absorbs the third visible light.

The light-absorbing material that selectively absorbs the third visible light may be, for example, an organic material, for example quinacridone or a derivative thereof, subphthalocyanine or a derivative thereof, thiophene or a derivative thereof, or polythiophene or a derivative thereof, but is not limited thereto.

The light-absorption layer 30 may include an intrinsic layer (I layer), and a p-type semiconductor and an n-type semiconductor of the intrinsic layer may be included in a volume ratio of about 10:1 to about 1:10, for example about 8:2 to about 2:8, or for example about 6:4 to about 4:6. The light-absorption layer 30 may further include a p-type layer and/or an n-type layer on one side or both sides of the intrinsic layer, and the p-type layer may include a p-type semiconductor while the n-type layer may include an n-type semiconductor. For example, the light-absorption layer 30 may include various combinations, e.g., a p-type layer/I layer, an I layer/n-type layer, or a p-type layer/I layer/n-type layer.

The light-absorption layer 30 may include a p-type layer and an n-type layer. The p-type layer may include a p-type semiconductor and the n-type layer may include an n-type semiconductor.

The light-absorption layer 30 may have a thickness of about 1 nm to about 500 nm. Within the range, the light-absorption layer 30 may have a thickness of about 5 nm to about 300 nm. When light-absorption layer 30 has a thickness within the range, the active layer may effectively absorb light, effectively separate holes from electrons, and deliver them, effectively improving photoelectric conversion efficiency.

At least one auxiliary layer (not shown) may be further included between the lower electrode 10 and the light-absorption layer 30 and/or the upper electrode 20 and the light-absorption layer 30. The auxiliary layer may further facilitate the movement of holes and electrons separated from the light-absorption layer 30 to enhance efficiency of the photoelectric device 100.

The auxiliary layer may be at least one selected from, for example, a hole injection layer (HIL) facilitating hole injection, a hole transport layer (HTL) facilitating hole transportation, an electron blocking layer (EBL) blocking electron transportation, an electron injection layer (EIL) facilitating electron injection, an electron transport layer (ETL) facilitating electron transportation, and a hole blocking layer (HBL) blocking hole transportation.

The auxiliary layer may include, for example, an organic material, an inorganic material, or an organic/inorganic material. The organic material may be an organic compound having hole or electron characteristics, and the inorganic material may be, for example, a metal oxide, for example, molybdenum oxide, tungsten oxide, nickel oxide, etc.

In the photoelectric device 100, when light enters from the upper electrode 20 and the light-absorption layer 30 selectively absorbs the third visible light, excitons may be produced from the inside. The excitons are separated into holes and electrons in the light-absorption layer 30, and the separated holes are transported to an anode that is one of the lower electrode 10 and the upper electrode 20 and the separated electrons are transported to the cathode that is the other of the lower electrode 10 and the upper electrode 20 so as to flow a current.

Other light except the third visible light absorbed by the light absorption layer 30 among light incident from the upper electrode 20 may pass through the lower electrode 10, for example, the first visible light having a shorter wavelength region than the third visible light may pass through the first color filter 70*a* to be sensed by the first photo-sensing device 50*a*, and the second visible light having a longer wavelength region than the third visible light may pass through the second color filter 70*b* to be sensed by the second photo-sensing device 50*b*.

A focusing lens (not shown) may be further formed on the photoelectric device 100. The focusing lens may control a direction of incident light and gather the light in one region. The focusing lens may have a shape of, for example, a cylinder or a hemisphere, but is not limited thereto.

As in the above, the image sensor having a stacking structure may implement a compact image sensor, so that it may accomplish the down-sized image sensor.

Meanwhile, in the image sensor having the stacking structure, the color signal of the first photo-sensing device 50*a* and the second photo-sensing device 50*b* disposed in a lower part may be distorted by the photoelectric device 100 receiving light first, and the color signal of the first photo-sensing device 50*a* and the second photo-sensing device 50*b* may be distorted by the stacking structure.

Thereby, according to example embodiments, the light transmission characteristics of the first color filter 70*a* and the second color filter 70*b* are modified to be suitable for the image sensor having a stacking structure, so as to reduce or to prevent the color signal distortion of the first photo-sensing device 50*a* and the second photo-sensing device 50*b*. Specifically, the maximum transmission wavelength of the first color filter 70*a* and the second color filter 70*b* may be modified.

Figure 3:
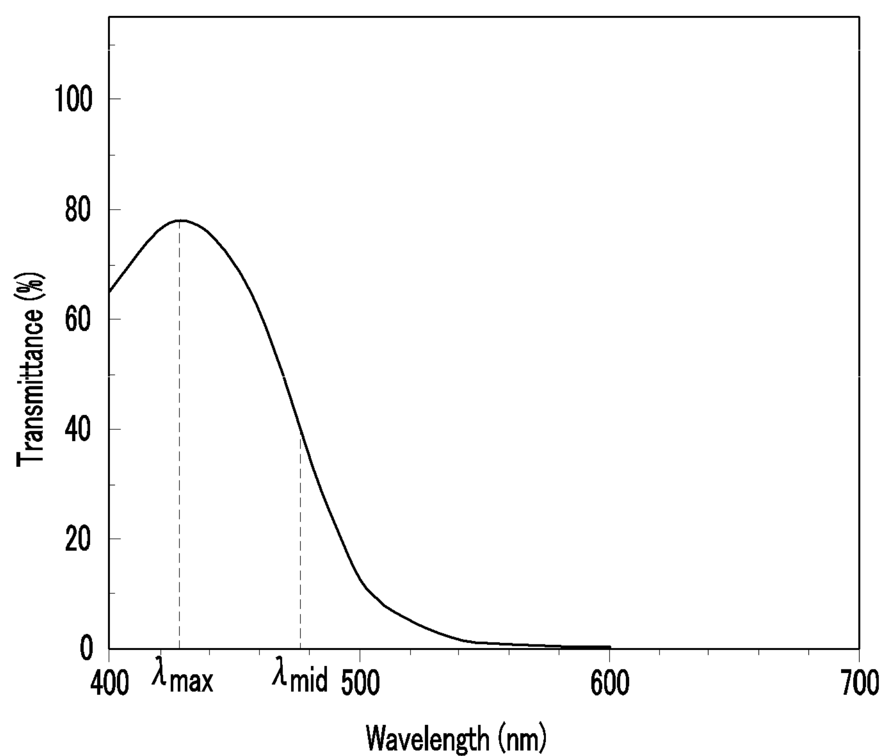
FIG. 3 is a graph showing light transmission of a first color filter in an image sensor according to example embodiments.

FIG. 3 is a graph showing light transmission of the first color filter 70*a* in the image sensor according to example embodiments.

Referring to FIG. 3, the first color filter 70*a* may have a maximum transmission wavelength ($\lambda_{max}$) of less than about 440 nm. The maximum transmission wavelength ($\lambda_{max}$) refers to a wavelength corresponding to the position showing the maximum transmission. The first color filter 70*a* may have a maximum transmission wavelength ($\lambda_{max}$) of, for example, greater than or equal to about 380 nm and less than about 440 nm, within the range, for example, greater than or equal to about 400 nm and less than about 440 nm, and within the range, for example, greater than or equal to about 400 nm and less than or equal to about 438 nm.

As in the above, by using the first color filter 70*a* having a maximum transmission wavelength ($\lambda_{max}$) of less than about 440 nm in the image sensor according to example embodiments, it may transmit light in a deep blue region compared to the blue filter having a maximum transmission wavelength of about 440 nm to about 480 nm which is employed in the non-stacked image sensor, so as to effectively reduce or to prevent the color signal distortion generated by the photoelectric device 100.

By shifting the maximum transmission wavelength ($\lambda_{max}$) of the first color filter 70*a* as in the above, the wavelength ($\lambda_{mid}$) corresponding to the half of maximum transmission may be, for example, less than about 480 nm. The wavelength ($\lambda_{mid}$) corresponding to half of the maximum transmission of the first color filter 70*a* may be, for example, greater than or equal to about 420 nm and less than about 480 nm.

Figure 4:
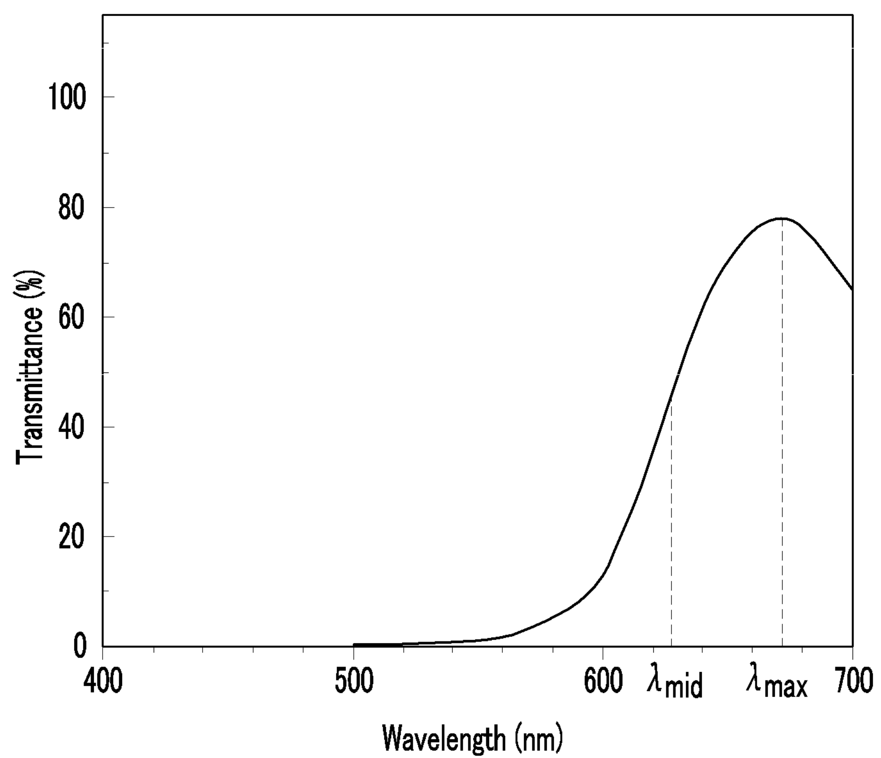
FIG. 4 is a graph showing light transmission of a second color filter in an image sensor according to example embodiments.

FIG. 4 is a graph showing the light transmission of the second color filter 70*b* in an image sensor according to example embodiments.

Referring to FIG. 4, the second color filter 70*b* may have a maximum transmission wavelength ($\lambda_{max}$) of greater than about 630 nm. The second color filter 70*b* may have a maximum transmission wavelength ($\lambda_{max}$) of, for example, greater than about 630 nm and less than or equal to about 700 nm, within the range, for example, greater than about 630 nm and less than or equal to about 670 nm, and within the range, for example, greater than or equal to about 632 nm and less than or equal to about 670 nm.

In this way, by using the second color filter 70*b* having a maximum transmission wavelength ($\lambda_{max}$) of greater than about 630 nm in the image sensor according to example embodiments, it may transmit light in the deep red region compared to the red filter having a maximum transmission wavelength of about 590 nm to about 630 nm which is employed for a non-stacked image sensor, so as to effectively reduce or to prevent the color signal distortion generated by the photoelectric device 100.

By shifting the maximum transmission wavelength ($\lambda_{max}$) of the second color filter 70*b* as in the above, the wavelength ($\lambda_{mid}$) corresponding to half of the maximum transmission of the second color filter 70*b* may be, for example, greater than about 610 nm. The wavelength ($\lambda_{mid}$) corresponding to half of the maximum transmission of the second color filter 70*b* may be, for example, greater than about 610 nm and less than or equal to about 680 nm.

Hereinafter, one example of an image sensor according to example embodiments is described.

Although the image sensor according to example embodiments has a structure in which each of the first light detecting device, the second light detecting device, and the third light detecting device includes a photoelectric device, example embodiments are not limited thereto.

Figure 5:
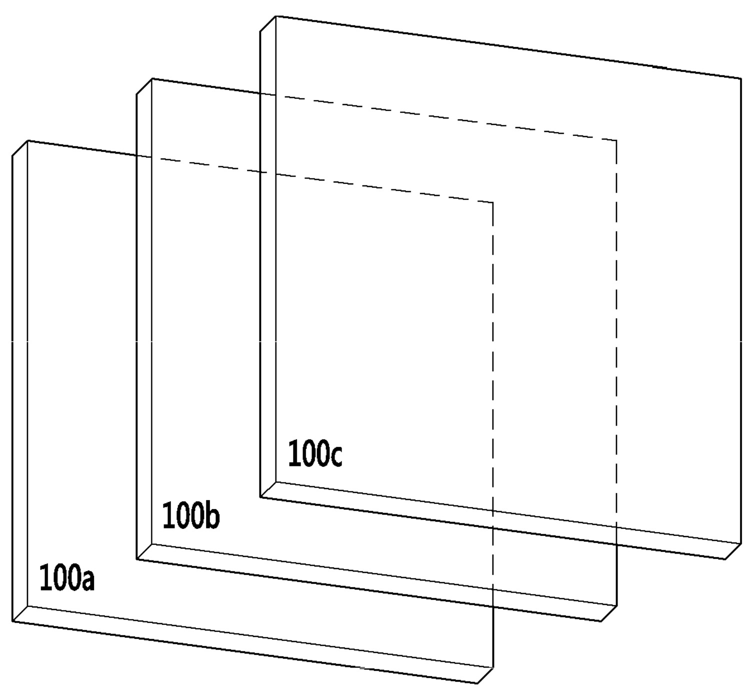
FIG. 5 is a top plan view schematically showing one example of an image sensor according to example embodiments.
Figure 6:
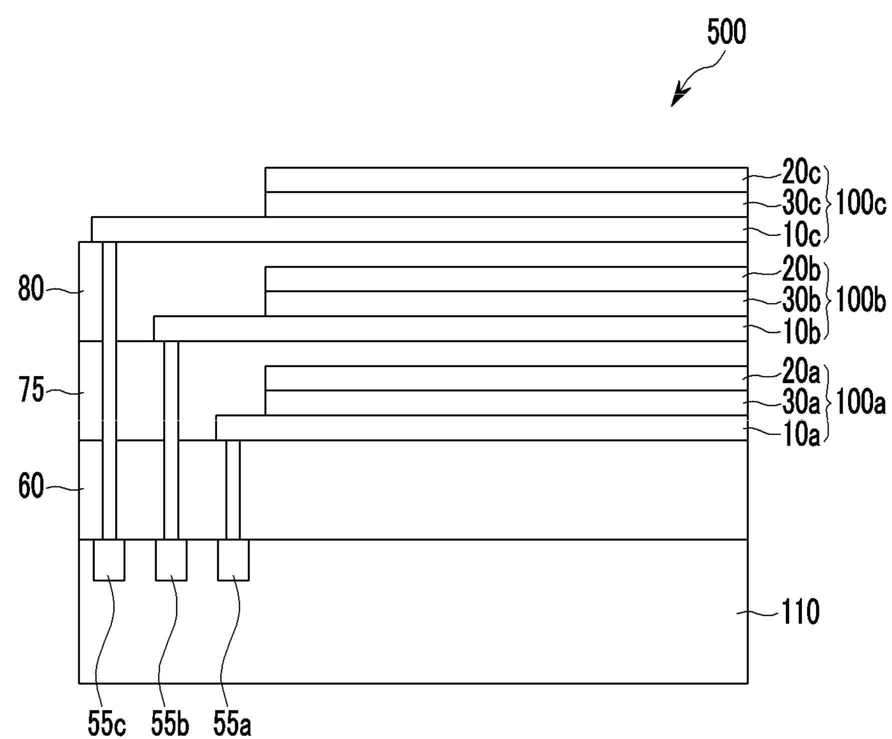
FIG. 6 is a cross-sectional view showing an image sensor shown in FIG. 5.

FIG. 5 is a top plan view schematically showing one example of an image sensor according to example embodiments, and FIG. 6 is a cross-sectional view showing the image sensor shown in FIG. 5.

Referring to FIG. 5, the image sensor according to example embodiments has a structure in which photoelectric devices 100*a*, 100*b*, and 100*c* are sequentially stacked. The stacked order of photoelectric devices 100*a*, 100*b*, and 100*c* shown in FIG. 5 may be variously changed.

Referring to FIGS. 5 and 6, an image sensor 500 according to example embodiments includes a semiconductor substrate 110, a lower insulation layer 60, an intermediate insulation layer 75, an upper insulation layer 80, and the photoelectric devices 100*a*, 100*b*, and 100*c*.

The semiconductor substrate 110 may be a silicon substrate, and may be integrated with a transmission transistor (not shown) and charge storages 55*a*, 55*b*, and 55*c*.

Metal wires (not shown) and pads (not shown) may be formed on the semiconductor substrate 110, and the lower insulation layer 60 is formed on the metal wires and pads.

The photoelectric device 100*a* is formed on the lower insulation layer 60.

The photoelectric device 100*a* includes a lower electrode 10*a* and an upper electrode 20*a* facing each other, and a light-absorption layer 30*a* between the lower electrode 10*a* and the upper electrode 20*a*.

One of the lower electrode 10*a* and the upper electrode 20*a* is an anode and the other is a cathode. At least one of the lower electrode 10*a* and the upper electrode 20*a* may be a light-transmitting electrode, and for example, the lower electrode 10*a* and the upper electrode 20*a* may be light-transmitting electrodes.

The light-absorption layer 30*a* selectively absorbs, for example, second visible light, and for example, mainly absorbs light in a wavelength region of greater than about 600 nm and less than or equal to about 700 nm. The light-absorption layer 30*a* may include a p-type semiconductor and an n-type semiconductor, and at least one of the p-type semiconductor and the n-type semiconductor may be a light-absorbing material that selectively absorbs second visible light. The light-absorption layer 30*a* may be an I layer, a p-type layer/I layer, an I layer/n-type layer, a p-type layer/I layer/n-type layer, a p-type layer/n-type layer, etc.

At least one auxiliary layer (not shown) may be further included between the lower electrode 10*a* and the light-absorption layer 30*a* and/or the upper electrode 20*a* and the light-absorption layer 30*a*. The auxiliary layer may further facilitate the movement of holes and electrons separated from the light-absorption layer 30*a* to enhance efficiency of the photoelectric device 100*a*.

The auxiliary layer may be at least one selected from, for example, a hole injection layer (HIL) facilitating hole injection, a hole transport layer (HTL) facilitating hole transportation, an electron blocking layer (EBL) blocking electron transportation, an electron injection layer (EIL) facilitating electron injection, an electron transport layer (ETL) facilitating electron transportation, and a hole blocking layer (HBL) blocking hole transportation, but is not limited thereto.

The auxiliary layer may include, for example, an organic material, an inorganic material, or an organic/inorganic material. The organic material may be an organic compound having hole or electron characteristics, and the inorganic material may be, for example, a metal oxide, e.g., molybdenum oxide, tungsten oxide, nickel oxide, etc.

The intermediate insulation layer 75 is formed on the photoelectric device 100*a*.

The photoelectric device 100*b* is formed on the intermediate insulation layer 75.

The photoelectric device 100*b* includes a lower electrode 10*b* and an upper electrode 20*b* facing each other, and a light-absorption layer 30*b* between the lower electrode 10*b* and the upper electrode 20*b*.

One of the lower electrode 10*b* and the upper electrode 20*b* is an anode and the other is a cathode. At least one of the lower electrode 10*b* and the upper electrode 20*b* may be a light-transmitting electrode, and for example, the lower electrode 10*b* and the upper electrode 20*b* may be light-transmitting electrodes.

The light-absorption layer 30*b* selectively absorbs, for example, first visible light, and for example, mainly absorbs light in a wavelength region of greater than or equal to about 380 nm and less than about 500 nm. The light-absorption layer 30*b* may include a p-type semiconductor and an n-type semiconductor, and at least one of the p-type semiconductor and the n-type semiconductor may be a light-absorbing material that selectively absorbs first visible light. The light-absorption layer 30*b* may be an I layer, a p-type layer/I layer, an I layer/n-type layer, a p-type layer/I layer/n-type layer, a p-type layer/n-type layer, etc.

At least one auxiliary layer (not shown) may be further included between the lower electrode 10*b* and the light-absorption layer 30*b* and/or the upper electrode 20*b* and the light-absorption layer 30*b*. The auxiliary layer may further facilitate the movement of holes and electrons separated from the light-absorption layer 30*b* to enhance efficiency of the photoelectric device 100*b*.

The auxiliary layer may be at least one selected from, for example, a hole injection layer (HIL) facilitating hole injection, a hole transport layer (HTL) facilitating hole transportation, an electron blocking layer (EBL) blocking electron transportation, an electron injection layer (EIL) facilitating electron injection, an electron transport layer (ETL) facilitating electron transportation, and a hole blocking layer (HBL) blocking hole transportation, but is not limited thereto.

The auxiliary layer may include, for example, an organic material, an inorganic material, or an organic/inorganic material. The organic material may be an organic compound having hole or electron characteristics, and the inorganic material may be, for example, a metal oxide, e.g., molybdenum oxide, tungsten oxide, nickel oxide, etc.

The upper insulation layer 80 is formed on the photoelectric device 100*b*. The lower insulation layer 60, the intermediate insulation layer 75 and the upper insulation layer 80 may have a plurality of through-holes exposing the charge storages 55*a*, 55*b*, and 55*c*.

The photoelectric device 100*c* is formed on the upper insulation layer 80. The photoelectric device 100*c* includes a lower electrode 10*c* and an upper electrode 20*c* facing each other, and a light-absorption layer 30*c* between the lower electrode 10*c* and the upper electrode 20*c*.

One of the lower electrode 10*c* and the upper electrode 20*c* is an anode and the other is a cathode. At least one of the lower electrode 10*c* and the upper electrode 20*c* may be a light-transmitting electrode, and for example, the lower electrode 10*c* and the upper electrode 20*c* may be light-transmitting electrodes.

The light-absorption layer 30*c* selectively mainly absorbs third visible light. The third visible light may be, for example, light in a wavelength region of about 500 nm to about 600 nm, and a maximum absorption wavelength of the light-absorption layer 30*c* may be, for example, about 520 nm to about 560 nm.

The light-absorption layer 30*c* may include a p-type semiconductor and an n-type semiconductor, and at least one of the p-type semiconductor and the n-type semiconductor may be a light-absorbing material that selectively absorbs third visible light. The light-absorption layer 30*c* may be an I layer, a p-type layer/I layer, an I layer/n-type layer, a p-type layer/I layer/n-type layer, a p-type layer/n-type layer, etc.

At least one auxiliary layer (not shown) may be further included between the lower electrode 10*c* and the light-absorption layer 30*c* and/or the upper electrode 20*c* and the light-absorption layer 30*c*. The auxiliary layer may further facilitate the movement of holes and electrons separated from the light-absorption layer 30*c* to enhance efficiency of the photoelectric device 100*c*.

The auxiliary layer may be at least one selected from, for example, a hole injection layer (HIL) facilitating hole injection, a hole transport layer (HTL) facilitating hole transportation, an electron blocking layer (EBL) blocking electron transportation, an electron injection layer (EIL) facilitating electron injection, an electron transport layer (ETL) facilitating electron transportation, and a hole blocking layer (HBL) blocking hole transportation, but is not limited thereto.

The auxiliary layer may include, for example an organic material, an inorganic material, or an organic/inorganic material. The organic material may be an organic compound having hole or electron characteristics, and the inorganic material may be, for example, a metal oxide, e.g., molybdenum oxide, tungsten oxide, nickel oxide, etc.

A focusing lens (not shown) may be further formed on the photoelectric device 100*c*. The focusing lens may control a direction of incident light and gather the light in one region. The focusing lens may have a shape of, for example, a cylinder or a hemisphere, but is not limited thereto.

In the drawings, it exemplifies a structure in which a photoelectric device 100*a* selectively absorbing second visible light, a photoelectric device 100*b* selectively absorbing first visible light, and a photoelectric device 100*c* selectively absorbing third visible light are sequentially stacked, but example embodiments are not limited thereto, and the stacking structure may be variously changed.

By having a structure in which the first light detecting device, the second light detecting device, and the third light detecting device absorbing light in the different regions from each other are stacked, the size of the image sensor is further decreased to accomplish a down-sized image sensor.

Meanwhile, in the image sensor having a stacking structure according to example embodiments, the color signal of the photoelectric devices 100*a* and 100*b* disposed in the lower part may be distorted by a photoelectric device 100*c* receiving light first, and the color signal of the photoelectric devices 100*a* and 100*b* may be distorted by the stacking structure.

Thus, according to example embodiments, the light absorption characteristics of the light-absorption layer 30*b* of the photoelectric device 100*b* and the light-absorption layer 30*c* of the photoelectric device 100*a* may be modified to be suitable for an image sensor having a stacking structure, so as to effectively reduce or to prevent the color signal distortion of the photoelectric devices 100*a* and 100*b*. Specifically, the maximum absorption wavelength of the light-absorption layer 30*b* of the photoelectric device 100*b* and the light-absorption layer 30*c* of the photoelectric device 100*a* may be modified.

Figure 7:
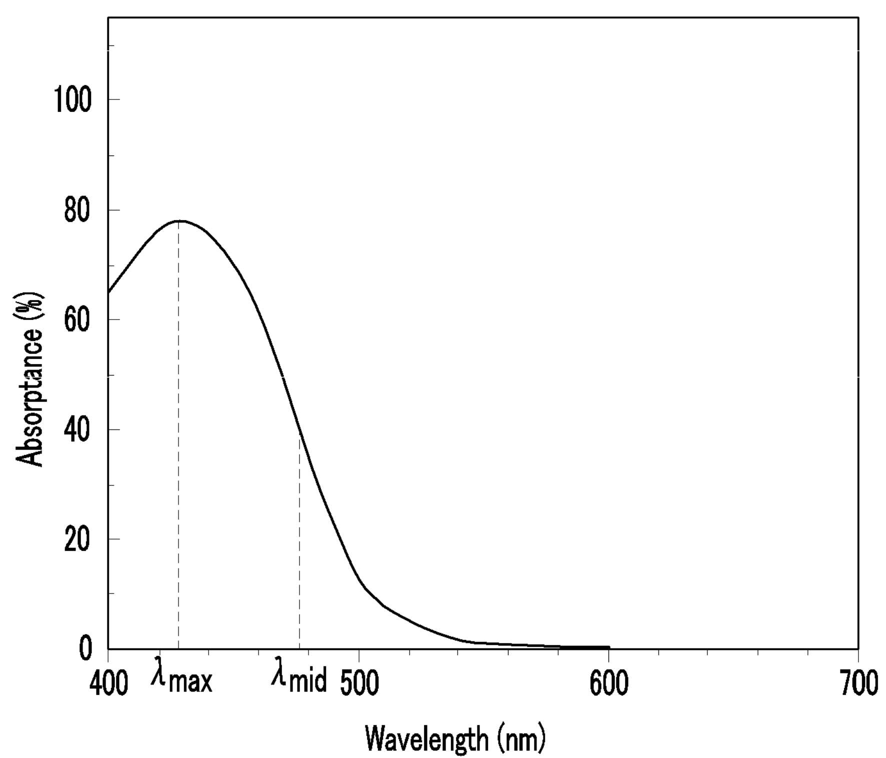
FIG. 7 is a graph showing absorbance of a photoelectric device in the image sensor according to example embodiments.

FIG. 7 is a graph showing absorbance of the photoelectric device 100*b* in the image sensor according to example embodiments.

Referring to FIG. 7, the light-absorption layer 30*b* of the photoelectric device 100*b* may have a maximum absorption wavelength ($\lambda_{max}$) of less than about 440 nm. The maximum absorption wavelength ($\lambda_{max}$) refers to a wavelength corresponding to a position showing maximum absorbance. The light-absorption layer 30*b* of the photoelectric device 100*b* may have a maximum absorption wavelength ($\lambda_{max}$) of, for example, greater than or equal to about 380 nm and less than about 440 nm.

When the image sensor according to example embodiments includes a light-absorption layer 30*b* having a maximum absorption wavelength ($\lambda_{max}$) of less than about 440 nm, it may absorb light in a deep blue region compared to the blue filter having the maximum absorption wavelength of about 440 nm to about 480 nm which has been employed by a non-stacked image sensor, so as to effectively reduce or to prevent the color signal distortion generated by the photoelectric device 100*c* disposed in the upper part.

By shifting the maximum absorption wavelength ($\lambda_{max}$) of the light-absorption layer 30*b* of the photoelectric device 100*b*, the wavelength ($\lambda_{mid}$) corresponding to half of the maximum absorption position of the light-absorption layer 30*b* may be, for example, less than about 480 nm. The wavelength ($\lambda_{mid}$) corresponding to half of the maximum absorption position of the light-absorption layer 30*b* of the photoelectric device 100*b* may be, for example, greater than or equal to about 420 nm and less than about 480 nm.

Figure 8:
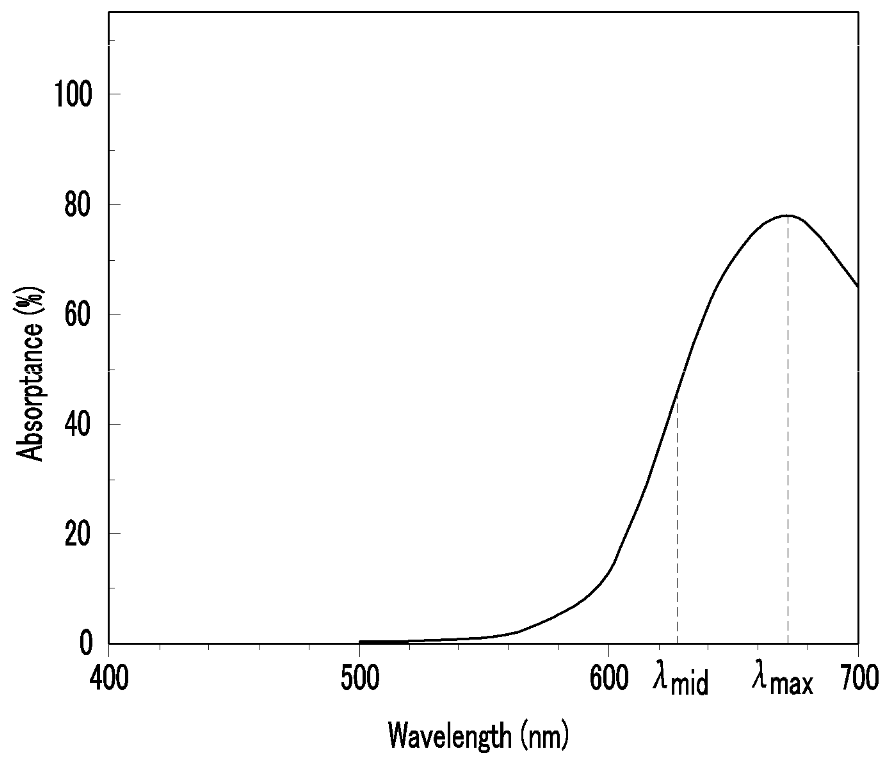
FIG. 8 is a graph showing absorbance of a photoelectric device 100*a* in the image sensor according to example embodiments.

FIG. 8 is a graph showing absorbance of photoelectric device 100*a* in an image sensor according to example embodiments.

Referring to FIG. 8, the light-absorption layer 30*a* of the photoelectric device 100*a* may have a maximum absorption wavelength ($\lambda_{max}$) of greater than about 630 nm. The light-absorption layer 30*a* of the photoelectric device 100*a* may have a maximum absorption wavelength ($\lambda_{max}$) of, for example, greater than about 630 nm and less than or equal to about 700 nm.

When the image sensor according to example embodiments includes a light-absorption layer 30*a* having a maximum absorption wavelength ($\lambda_{max}$) of greater than about 630 nm, it may absorb light in a deep red region compared to the red filter having the maximum absorption wavelength of about 590 nm to about 630 nm which has been employed by a non-stacked image sensor, so as to effectively reduce or to prevent the color signal distortion generated by the photoelectric devices 100*b* and 100*c* disposed in the upper part.

By shifting the maximum absorption wavelength ($\lambda_{max}$) of the light-absorption layer 30*a* of the photoelectric device 100*a*, the wavelength ($\lambda_{mid}$) corresponding to half of the maximum absorption position of the light-absorption layer 30*a* may be, for example, greater than about 610 nm. The wavelength ($\lambda_{mid}$) corresponding to half of the maximum transmission of the light-absorption layer may be, for example, greater than about 610 nm and less than or equal to about 680 nm.

The image sensor may be applied to, for example, various electronic devices, e.g., a mobile phone or a digital camera, but is not limited thereto.

Hereinafter, the present disclosure is illustrated in more detail with reference to examples. However, these are examples, and the present disclosure is not limited thereto.

Design of Image Sensor

Example 1

An image sensor is designed to have the structure shown in FIGS. 1 and 2.

Figure 9:
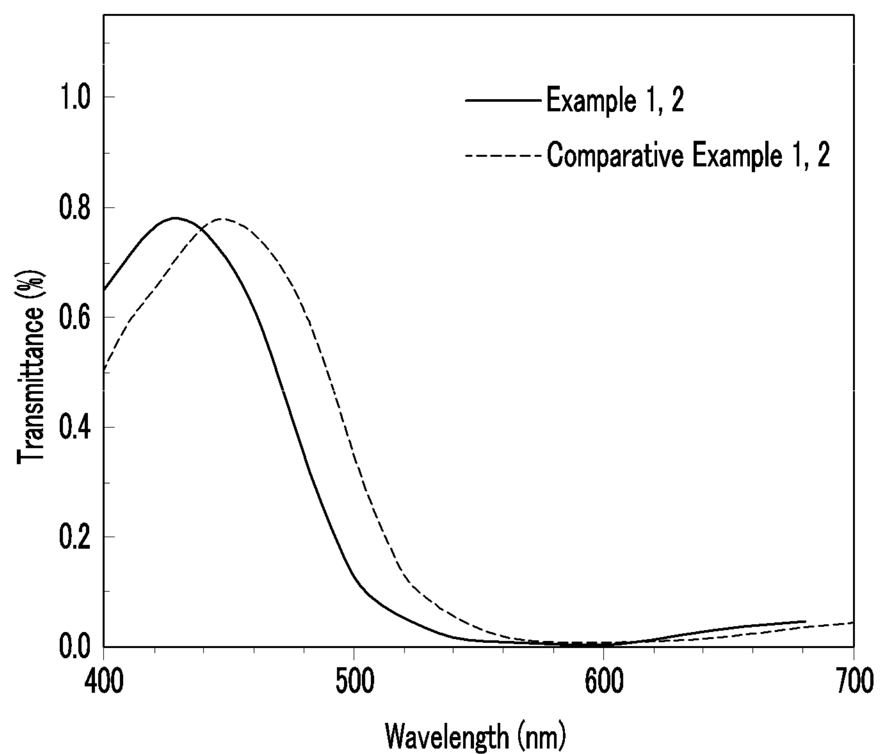
FIG. 9 is a graph showing light transmission characteristics of first color filters in image sensors according to Examples 1 and 2 and Comparative Examples 1 and 2.
Figure 10:
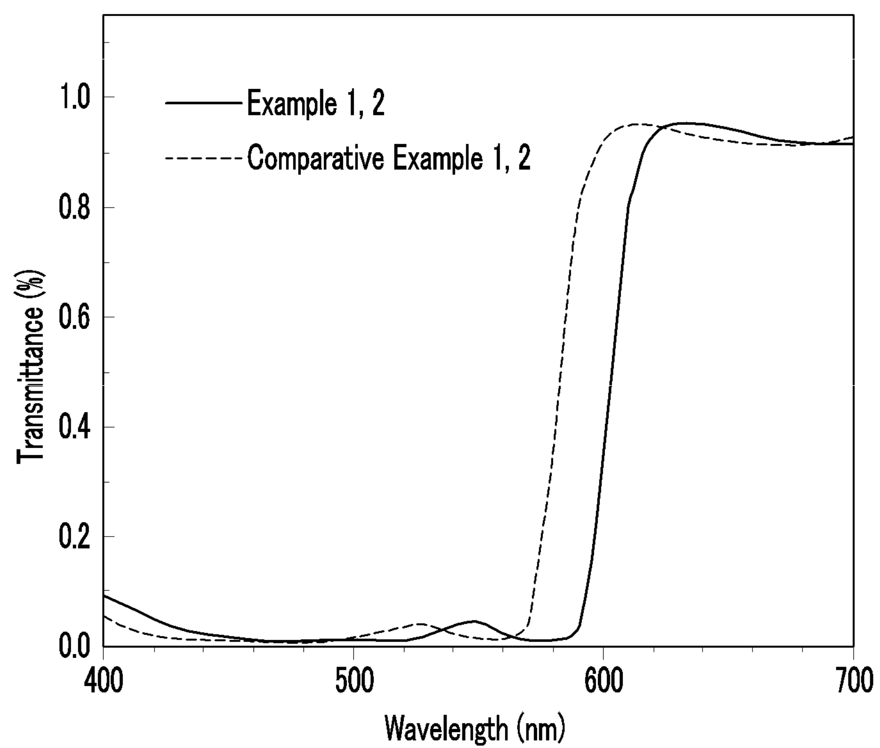
FIG. 10 is a graph showing light transmission characteristics of second color filters in image sensors according to Examples 1 and 2 and Comparative Examples 1 and 2.

FIG. 9 is a graph showing the light transmission characteristics of the first color filters in the image sensors according to Examples 1 and 2 and Comparative Examples 1 and 2, and FIG. 10 is a graph showing the light transmission characteristics of the second color filters in the image sensors according to Examples 1 and 2 and Comparative Examples 1 and 2.

The image sensor is designed with a first color filter (70*a*, $\lambda_{max}$=435 nm) showing the light transmission characteristics shown in FIG. 9 and a second color filter (70*b*, $\lambda_{max}$=635 nm) showing the light transmission characteristics shown in FIG. 10, and the organic photoelectric device 100 is designed with an ITO lower electrode (anode) 10 having a thickness of 150 nm, a green light-absorption layer ($\lambda_{max}$=540 nm) 30, and an ITO upper electrode (cathode) 30 having a thickness of 7 nm.

Example 2

An image sensor is designed to have a structure shown in FIG. 1 and FIG. 2.

The image sensor is designed with a first color filter (70*a*, $\lambda_{max}$=435 nm) showing the light transmission characteristics shown in FIG. 9 and a second color filter (70*b*, $\lambda_{max}$=635 nm) showing the light transmission characteristics shown in FIG. 10, and the organic photoelectric device 100 is designed with an ITO anode 10 having a thickness of 150 nm, a green light-absorption layer ($\lambda_{max}$=560 nm), 30 and an ITO cathode 30 having a thickness of 7 nm.

Comparative Example 1

An image sensor is designed to have a structure shown in FIG. 1 and FIG. 2.

The image sensor is designed with a first color filter (70*a*, $\lambda_{max}$=450 nm) showing the light transmission characteristics shown in FIG. 9 and a second color filter (70*b*, $\lambda_{max}$=615 nm) showing the light transmission characteristics shown in FIG. 10, and the organic photoelectric device 100 is designed with an ITO anode 10 having a thickness of 150 nm, a green light-absorption layer ($\lambda_{max}$=540 nm) 30, and an ITO cathode 30 having a thickness of 7 nm.

Comparative Example 2

An image sensor is designed to have a structure shown in 1 and FIG. 2.

The image sensor is designed with a first color filter (70*a*, $\lambda_{max}$=450 nm) showing the light transmission characteristics shown in FIG. 9 and a second color filter (70*b*, $\lambda_{max}$=615 nm) showing the light transmission characteristics shown in FIG. 10, and the organic photoelectric device 100 is designed with an ITO anode 10 having a thickness of 150 nm, a green light-absorption layer ($\lambda_{max}$=560 nm) 30, and an ITO cathode 30 having a thickness of 7 nm.

Evaluation

Image sensors according to Examples 1 and 2 and Comparative Examples 1 and 2 are evaluated for a color difference and YSNR10.

The color difference of the image sensor is measured in accordance with the following process.

An RGB raw signal obtained by the image sensor undergoes image processing to reduce a difference from the real color. The image processing includes a white balancing step of equalizing an intensity difference of RGB signals and a color correcting step of reducing the color difference between the real colors of a Macbeth chart (24 colors) and the primary colors measured in the image sensor. The color correcting step may express colors after changing the original RGB signals measured in the image sensor by a color correction matrix (CCM), and the color characteristics of the image sensor may be represented by calculating how much the difference is from the real color of the Macbeth chart after the color change through the color correction matrix. The color difference refers to a difference from the real color of Macbeth chart, and means that less color difference is closer to the real color.

YSNR10 of the image sensor refers to illuminance (unit: lux) of bringing a rate of signal/noise to 10, wherein the signal is sensitivity of a signal after performing the color correction through the color correction matrix, and the noise is a noise occurring when measuring a signal in the image sensor. When the YSNR10 is less, it means that the image characteristics are better at a low illuminance.

The results are shown in Table 1.

In Table 1, the color difference is indicated by the highest color difference in the same average color difference, and YSNR10 is a value of calculating and comparing in the average color difference of 6.

TABLE 1

| | Color difference (ΔEab) | YSNR10 (lx) |
|---|---|---|
| Example 1 | 17 | 68 |
| Comparative Example 1 | 19 | 76 |
| Example 2 | 18 | 67 |
| Comparative Example 2 | 20 | 71 |

Referring to Table 1, it is confirmed that the image sensor according to Example 1 has less color difference and lower YSNR10 compared to the image sensor according to Comparative Example 1. Further, it is confirmed that the image sensor according to Example 2 has less color difference and lower YSNR10 compared to the image sensor according to Comparative Example 2. Thereby, it is anticipated that the image sensors according to Examples 1 and 2 may improve the color reproducing characteristics compared to the image sensors according to Comparative Examples 1 and 2.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An image sensor comprising:

a first light detecting device configured to selectively sense or absorb first visible light, the first visible light being light in a first wavelength region of greater than or equal to about 380 nm and less than about 500 nm;

a second light detecting device configured to selectively sense or absorb second visible light, the second visible light being light in a second wavelength region of greater than about 600 nm and less than about 700 nm; and a third light detecting device on the first light detecting device and the second light detecting device, the third light detecting device configured to selectively sense or absorb third visible light having a wavelength region between the first visible light and the second visible light, wherein the first light detecting device includes a first photo-sensing device configured to sense the first visible light, and a first color filter overlapping the first photo-sensing device, the first color filter having a peak transmission wavelength of less than about 440 nm, wherein the second light detecting device includes a second photo-sensing device configured to sense the second visible light, and a second color filter overlapping the second photo-sensing device, the second color filter having a peak transmission wavelength greater than about 630 nm, and wherein the first photo-sensing device and the second photo-sensing device are spaced apart from each other in a horizontal direction.

2. The image sensor of claim 1, wherein one of a peak transmission wavelength and a peak absorption wavelength of the first light detecting device is greater than or equal to about 380 nm and less than about 440 nm; and one of a peak transmission wavelength and a peak absorption wavelength of the second light detecting device is about greater than about 630 nm and less than or equal to about 700 nm.

3. The image sensor of claim 1, wherein one of a peak transmission wavelength and a peak absorption wavelength of the third light detecting device is about 520 nm to about 560 nm.

4. The image sensor of claim 1, wherein a wavelength corresponding to half of the peak transmission wavelength of the first color filter is less than about 480 nm; and a wavelength corresponding to half of the peak transmission wavelength of the second color filter is greater than about 610 nm.

5. The image sensor of claim 1, wherein the first photo-sensing device and the second photo-sensing device are integrated in a semiconductor substrate.

6. The image sensor of claim 1, wherein the third light detecting device comprises:

a first electrode and a second electrode facing each other; and a first light-absorption layer between the first electrode and the second electrode, the first light-absorption layer configured to selectively absorb the third visible light.

7. The image sensor of claim 6, wherein the first light-absorption layer includes a p-type semiconductor and an n-type semiconductor; and at least one of the p-type semiconductor and the n-type semiconductor selectively absorbs the third visible light.

8. The image sensor of claim 1, wherein the third light detecting device is closer to a light incident side than the first and second light detecting devices.

9. An electronic device comprising the image sensor of claim 1.

* * * * *